United States Patent

Merchant et al.

Patent Number: 6,100,587
Date of Patent: Aug. 8, 2000

[54] SILICON CARBIDE BARRIER LAYERS FOR POROUS LOW DIELECTRIC CONSTANT MATERIALS

[75] Inventors: Sailesh Mansinh Merchant; Sudhanshu Misra; Pradip Kumar Roy, all of Orlando, Fla.

[73] Assignee: Lucent Technologies Inc., Murray Hill, N.J.

[21] Appl. No.: 09/383,753

[22] Filed: Aug. 26, 1999

[51] Int. Cl.⁷ .................... H07L 23/485; H01L 21/4763
[52] U.S. Cl. .................. 257/751; 257/753; 257/759; 257/774; 438/627; 438/637; 438/623; 438/628; 438/644; 438/643
[58] Field of Search ................. 438/627, 625, 438/629, 633, 637, 643, 653, 672, 675, 624; 257/758, 77, 501, 506, 622, 751, 753, 759, 774

[56] References Cited

U.S. PATENT DOCUMENTS

| | | | |
|---|---|---|---|
| 4,565,741 | 1/1986 | Morimoto et al. | 428/427 |
| 5,168,080 | 12/1992 | Suzuki | 501/97 |
| 5,283,089 | 2/1994 | Bates | 428/344 |
| 5,391,517 | 2/1995 | Gelatos et al. | 438/643 |
| 5,472,650 | 12/1995 | Johnson et al. | 264/432 |
| 5,527,739 | 6/1996 | Parillo et al. | 438/627 |
| 5,580,822 | 12/1996 | Hayakawa et al. | 427/250 |
| 5,654,208 | 8/1997 | Harris et al. | 438/522 |
| 5,759,699 | 6/1998 | French | 428/447 |
| 5,837,318 | 11/1998 | French | 427/226 |
| 5,846,871 | 12/1998 | Lee et al. | 438/592 |
| 5,858,486 | 1/1999 | Metter et al. | 428/34.1 |
| 5,946,601 | 12/1999 | Wong et al. | 438/783 |
| 5,985,763 | 11/1999 | Hong et al. | 438/688 |
| 6,008,540 | 12/1999 | Lu et al. | 257/758 |

Primary Examiner—Wael Fahmy
Assistant Examiner—Hsien Ming Lee

[57] ABSTRACT

Interconnects in porous dielectric materials are coated with a SiC-containing material to inhibit moisture penetration and retention within the dielectric material. Specifically, SiC coatings doped with boron such as SiC(BN) show particularly good results as barrier layers for dielectric interconnects.

6 Claims, 2 Drawing Sheets

SILICON CARBIDE BARRIER LAYERS FOR POROUS LOW DIELECTRIC CONSTANT MATERIALS

FIELD OF THE INVENTION

The present invention relates generally to dielectrics used as substrates and semiconductors, and more specifically to the incorporation of a silicon carbide or silicon carbide doped barrier layer on a porous low-k dielectric layer.

BACKGROUND OF THE INVENTION

The integrated circuitry (IC) industry uses dielectric materials having a low dielectric constant (low-k materials) including nanoglass and xerogel materials. While these materials have excellent dielectric properties, such materials also tend to have high porosity. This can cause problems at the metallic interface as layers of metal or metal alloys contact dielectric surfaces. Windows or vias are etched or otherwise fashioned into the dielectric to form interconnects between various dielectric layers. Such vias contain various metals such as copper, tungsten, aluminum, or alloys thereof.

However, such metal layers often have migration problems whereby the various metallic elements leach into, or migrate, into the pores of the dielectric. Such migration can lead to a lack of uniformity in the overall properties of the semiconductor wafer produced. Further, the porous dielectric may allow moisture to creep into the pores. This can cause "outgassing" as current is run through the wafer, thus causing a potential circuit failure.

To solve this problem, various barrier layers have been tried which are inserted into the dielectric and positioned between the dielectric and the eventual metal plug. For example, such barrier layers comprise tantalum nitride, titanium nitride, or combinations thereof. Nevertheless, the problems of adhesion and moisture blocking have not been completely solved by the known barriers currently in use.

SUMMARY OF THE INVENTION

In one embodiment, the present invention is directed to a dielectric substrate comprising a barrier layer further comprising silicon carbide.

In a further embodiment, the present invention is directed to a silicon carbide barrier layer within a dielectric having an amount of boron-containing compound or elemental boron.

In another embodiment, the present invention relates to a semiconductor comprising a substrate having a conductor and a dielectric formed on the substrate. The dielectric is made from a porous material, preferably a xerogel or nanoglass composition. The dielectric has a via extending through the dielectric and exposing a surface of the conductor. The via and dielectric surface is coated with a silicon carbide-containing material that is preferably doped with boron, and most preferably is SiC(BN) (2 wt % boron). A metal plug is then deposited in the via. Optionally, additional layers may be included in the interconnect between the SiC-containing barrier layer and the metal plug.

In yet a further embodiment, the present invention is directed to a method for inhibiting the introduction of moisture to a porous dielectric substrate. A porous substrate having a conductor is provided, followed by forming a via through the substrate and exposing a surface of the conductor. A SiC-containing material is then deposited onto the substrate and into the via followed by depositing a metal into the via and onto the SiC-containing material.

BRIEF DESCRIPTION OF THE DRAWINGS

For a more complete understanding of the present invention, and the advantages thereof, reference is now made to the descriptions taken in conjunction with the accompanying drawings in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
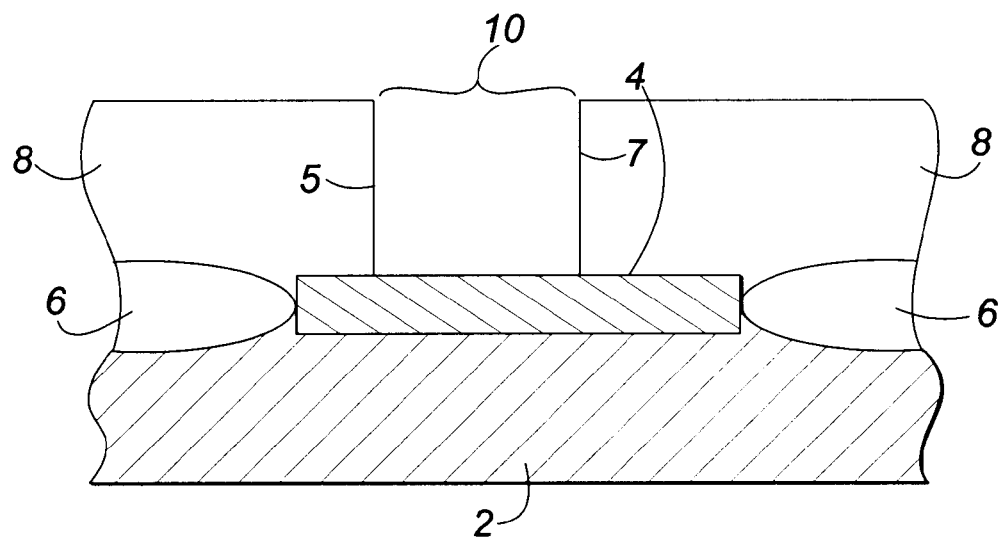
FIG. 1 is a cross-sectional representative view of an interconnect with via.

FIG. 1 shows an interconnect of a semiconductor in a cross-sectional representation 1. A silicon substrate 2 has a dielectric layer 8 deposited thereon. A window or via 10 is shown etched into and through the dielectric 8 exposing a conductor 4 and a conductive region 6. The via 10 has sidewalls 5,7.

Figure 2:
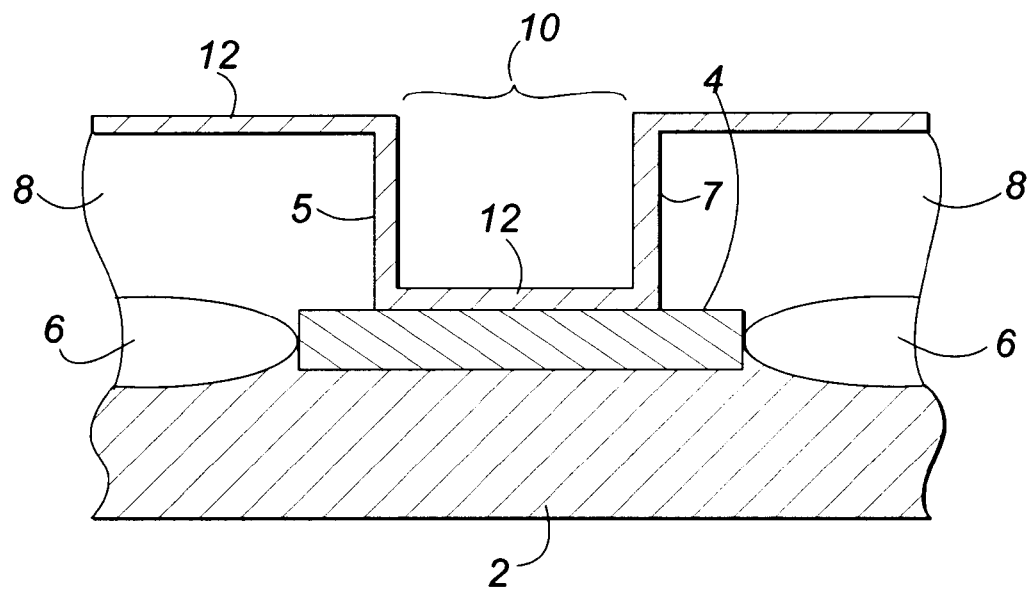
FIG. 2 shows the interconnect of FIG. 1 with a deposited barrier layer of the present invention.

FIG. 2 shows the interconnect of FIG. 1 with a barrier layer of the present invention deposited over the dielectric 8, covering the walls 5, 7 of the via, and covering the exposed surface of the conductor 4.

Figure 3:
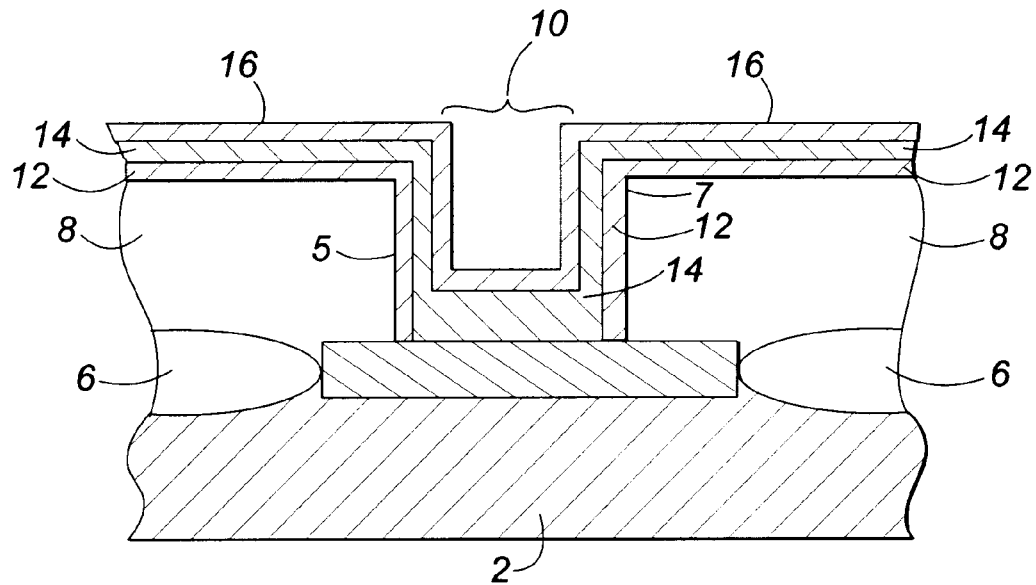
FIG. 3 shows the interconnect with barrier layer of FIG. 2 and subsequent layers deposited thereon.

FIG. 3 shows the interconnect of FIG. 2 with multiple optional layers deposited onto the barrier layer 12 A thin conductive layer 14 is shown deposited directly over the barrier layer 12. A refractory layer 16 is shown deposited onto the refractory layer 14. Finally, FIG. 4 shows the metallic plug 18 deposited into the via 10.

The dielectric layer 8 electrically isolates overlying conductive structures from the conductor 4, except at locations such as windows or vias 10 where contacts therebetween are desired. Such vias are created in the dielectric layer by reactive ion etching, anisotropic etching or other known photolithographic methods know to skilled practitioners in the field of semiconductor design and manufacture. The via opening 10 may be as small as less than one micron in width, as is common in modem integrated circuits. Preferably, the contact opening has a width that ranges from about 0.3 to about 0.8 microns and an aspect ratio that ranges from about 1.0 to about 3.0.

According to the present invention, a barrier layer is deposited onto the dielectric to inhibit the absorption of any moisture or any unwanted migration into the porous dielectric material. The barrier layer may be deposited by any suitable method, but is preferably deposited by chemical vapor deposition (CVD). The barrier layer comprises silicon carbide (SiC) or silicon carbide doped by chemical vapor impregnation (CVI) with a boron-containing compound, preferably boron nitride (SiC(BN)) The SiC when doped preferably contains an amount of BN up to about 2 wt. % of the SiC(BN).In this way, the barrier layer is deposited such that the proper diffusion lengths selected match the pore lengths in the dielectric. The reaction rates on the solid surfaces of the pores are controlled by the reaction sites available and the size of the pore/diffusing species. The present invention contemplates depositing the barrier material by other acceptable methods, but this above-described process of pore fill by chemical vapor impregnation (CVI) is ideally suited for passivating the dielectric nanoglass or xerogel surfaces.

Figure 4:
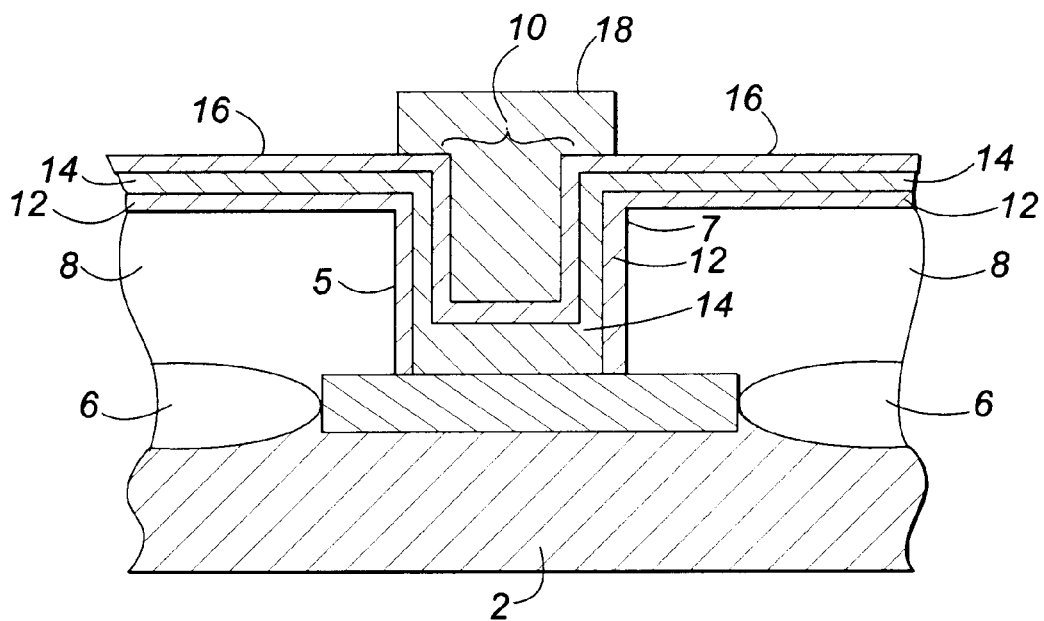
FIG. 4 depicts the interconnect of FIG. 3 showing the metallic plug and layer deposited to fill the via.

It is understood, as shown in FIG. 4, that the SiC barrier layer 12 deposited at the bottom of the vias must be removed prior to the deposition of the conducting metal layer 14 into the vias. Such removal is necessary to ensure low via resistance values. Any residual SiC(BN) in the bottom of the vias will impact the conductivity of the vias.

The SiC barrier layer 12 can be removed from the bottom of the vias by reactive ion etching (RIE) using $CHF_3$, or similar plasma etch chemistry as would be readily understood by one skilled in the field of integrated circuit manufacture. The RIE process converts SiC to volatile SiF and its derivatives that are removed from the vias in the gaseous phase. The RIE process is anisotropic in nature, and will remove the SiC(BN) layer from the top surface of the dielectric 8 (the bottom of the vias), while leaving the SiC(BN) layer 12 on the via sidewalls 5, 7.

While the resistivity of SiC alone is $10^2$ to $10^3$ ohm cm, the resistivity of SiC(BN) (2 wt %) is $10^{11}$ ohm cm which results in a significant and measureable difference in terms of interconnect and semiconductor performance. To obtain the optimum performance, passivation and adhesion properties on the resulting product, the SiC barrier layer of the present invention is deposited onto the dielectric at thicknesses of from about 200 Å to about 2000 Å, more preferably from about 500 Å to about 1000 Å, and most preferably 500 Å for the SiC(BN) (2 wt % BN).

The SiC barrier layer 12 may be covered with a deposited conductive layer 14 comprising titanium, tantalum, zirconium, hafnium, tungsten, molybdenum, alloys thereof, or combinations thereof. This layer may be deposited onto the barrier layer by sputtering or physical vapor deposition (PVD) techniques and at temperatures and pressures that are well known in the field of semiconductor design and manufacture. The thickness of this layer may range from about 50 Å to about 500 Å, and more preferably from about 100 Å to about 250 Å.

A further layer or layers may be deposited as desired. Such layers may be refractory layers as shown in FIGS. 2 and 3. Refractory layers may be deposited over the conductive layer to a preferred thickness of about 100 nm. Suitable refractory materials include but are not limited to titanium nitride, titanium carbide, and titanium boride, tantalum nitride, tantalum carbide, tantalum boride, zirconium nitride, zirconium carbide, zirconium boride, hafnium nitride, hafnium carbide, hafnium boride, tungsten nitride, tungsten carbide, tungsten boride, molybdenum nitride, molybdenum carbide, and molybdenum boride. Preferably, the refracting coating is made from titanium nitride. Conventional PVD methods may be used at known temperatures and pressures as would be understood by those skilled in the field.

Further layers, such as amorphous layers may be added and deposited onto the refractory material layer. Such a layer is preferably made from a metal-silicide compound. Silicon is bonded with a metal wherein the metal may be, for example, titanium. Tungsten, zirconium, molybdenum, tantalum or cobalt. Preferably the metal is a tungsten silicide ($WSi_x$) where x ranges between about 2 and 2.5. Once again conventional PVD methods may be used to effect the amorphous coating deposition.

A metal plug 18 as shown in FIG. 4 is then deposited into what is left of the via that has been, optionally, multiply coated with the above described layers. Aluminum, aluminum alloy, copper, copper alloy or other metals, their alloys or combinations thereof may be used. Today's interconnects commonly use aluminum, although there is a move in the industry toward copper metals which can carry more current on narrower surfaces than can aluminum due to its low resistivity.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A semiconductor comprising:

a substrate having a conductor;

a dielectric formed on the substrate, said dielectric made from a porous material having a via extending through the dielectric and exposing a surface of the conductor;

a silicon carbide-containing coating deposited on the dielectric; and a metal plug deposited on the silicon-carbide containing coating in the via.

2. The semiconductor of claim 1, wherein the silicon carbide is SiC(BN).

3. The semiconductor of claim 1, wherein the dielectric is made from a material selected from the group consisting of xerogels and nanoglasses.

4. The semiconductor of claim 1, wherein the SiC(BN) comprises about 2 weight % of boron.

5. The semiconductor of claim 1, further comprising additional layers disposed between the silicon carbide-containing coating and the metal plug.

6. The semiconductor of claim 1, wherein the metal plug is made from a material selected from group consisting of aluminum, aluminum alloy, cooper, and copper alloy.

* * * * *